United States Patent [19]

Reimer

[11] 3,745,288

[45] July 10, 1973

[54] FLEXIBLE PRINTED WIRING SWITCH

[75] Inventor: William A. Reimer, Wheaton, Ill.

[73] Assignee: GTE Automatic Electric Laboratories Incorporated, Northlake, Ill.

[22] Filed: Aug. 7, 1972

[21] Appl. No.: 278,498

[52] U.S. Cl......... 200/166 PC, 200/16 A, 200/16 D, 200/159 R, 200/164 R, 317/101 F

[51] Int. Cl. ............................................ H01h 1/00

[58] Field of Search.................. 200/166 PC, 164 R, 200/164 A, 159 B, 159 R, 11 R, 16 A, 16 D; 317/101 F

[56] References Cited

UNITED STATES PATENTS

| | | | |
|---|---|---|---|
| 3,643,049 | 2/1972 | LuConic et al. | 200/166 BB X |
| 3,553,030 | 1/1971 | Lebrun | 317/101 F |
| 3,030,460 | 4/1962 | Huetten et al. | 200/11 DA |
| 2,911,605 | 11/1959 | Wales | 317/101 F X |

*Primary Examiner*—Robert K. Schaefer
*Assistant Examiner*—William J. Smith
*Attorney*—K. Mullerheim, R. F. Van Epps et al.

[57] ABSTRACT

An electrical switch formed of a single flexible printed wiring element having a plurality of circuits to be selectively coupled and a shorting circuit. The flexible printed wiring element is folded upon itself such that the circuits to be coupled and the shorting circuit are facing. An actuator is provided to selectively urge the shorting circuit into and out of contact with the circuits to be coupled. Sliding and pushbutton embodiments of the invention are described.

9 Claims, 10 Drawing Figures

Patented July 10, 1973 3,745,288

2 Sheets-Sheet 2

FLEXIBLE PRINTED WIRING SWITCH

BACKGROUND OF THE INVENTION

1. Field of the Invention

The present invention relates generally to the field of electrical switches and in particular to a new and improved flexible printed wiring switch.

2. Description of the Prior Art

With the widespread use of printed circuitry a variety of switching arrangements have been devised to selectively couple various circuits together. In general these prior art arrangements have employed conductive elements separate from the printed circuitry itself to effect these connections. For electrical switches typical of this prior art reference may be had to U.S. Pat. Nos. 3,188,435; 3,350,530 and 3,476,901.

OBJECTS AND SUMMARY OF THE INVENTION

From the preceding discussion it will be understood that among the various objectives of the present invention are included the following:

the provision of a new and improved flexible printed wiring switch, and the provision of a switch of the above-described character wherein all electrical contact elements are disposed on a single flexible printed wiring element.

These as well as other objectives of the present invention are efficiently met by providing a unitary flexible printed wiring element having a plurality of longitudinal circuits and a spaced apart transversely disposed shorting circuit on one surface thereof. The flexible element is folded upon itself such that the longitudinal circuits and shorting circuit face one another. An actuator is provided for selectively urging the shorting circuit into electrical contact with the longitudinal circuits to thereby selectively couple the latter together.

The foregoing and other objects, features and advantages of the present invention will become more apparent from the following detailed description taken in conjunction with the various views of the appended drawings.

DESCRIPTION OF THE PREFERRED EMBODIMENTS

Figures 1A, 1B:
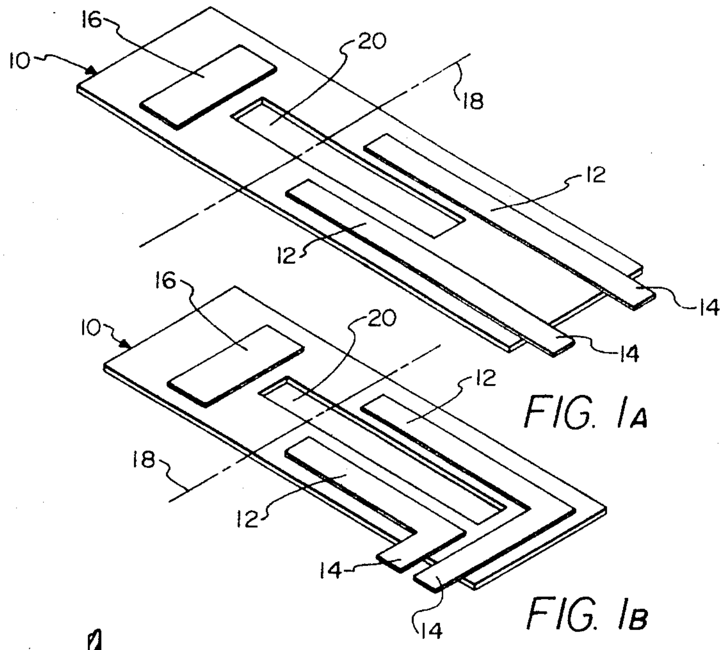
FIGS. 1A and 1B are elevation views of two printed wiring elements of utility in the practice of the present invention.

With reference now to FIGS. 1A and 1B there are illustrated two embodiments of the flexible printed wiring element of the present invention. Both involve the use of a rectangular flexible printed circuit substrate 10 having a plurality of substantially parallel longitudinally disposed circuits 12 to be coupled together. The embodiments of FIGS. 1A and 1B differ only with respect to the location at which the ends 14 of circuits 12 exit the substrate 10. Each is provided with a shorting circuit 16 disposed transversely on the substrate 10 at a position spaced apart from the longitudinal circuits 12. The flexible printed wiring element is adapted to be folded, such as at hinge line 18, so that the shorting circuit 16 faces the longitudinal circuits 12. It is preferred in the practice of this invention that the hinge line 18 not pass through any of the switch circuits 12 or 16 in order to avoid fatigue and circuit breakage. The substrate 10 may further be provided with a rectangular aperture 20 disposed between the longitudinal circuits 12 depending upon the type of switch to be constructed as will be described hereinbelow.

Figure 2:
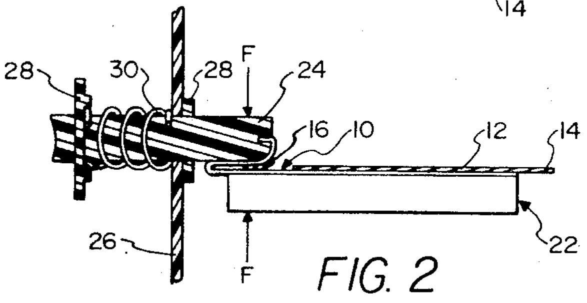
FIG. 2 is a cross-section view of a normally open slide switch embodiment of the present invention.

FIG. 2 illustrates in cross-section a slide switch embodiment of the present invention using the flexible printed wiring element of FIGS. 1A and 1B wherein provision of the rectangular aperture 20 is unnecessary. A base member 22 is used to support that portion of the printed wiring element which includes the longitudinal circuits 12. The end of the substrate 10 proximate the shorting circuit 16 is affixed to an actuator 24 which may be adapted for mounting through a panel 26, with a suitable arrangement of flanges 28 and a return spring 30 which may be disposed on either side of the panel to bias the actuator 24 in either a normally open (as illustrated) or normally closed state. The operation of this embodiment of the invention relies upon a rolling action of the flexible substrate 10 between the circuits 12 and 16.

Figure 2A:
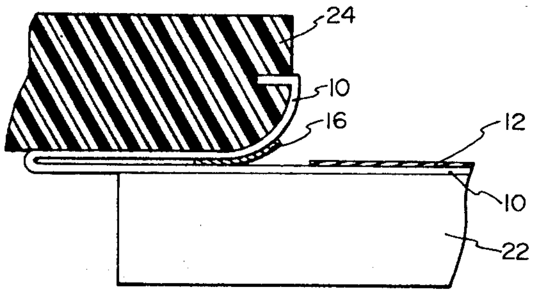
FIGS. 2A and 2B are more detailed cross-section views of the electrical contact portions of the switch of FIG. 2 in the open and closed positions respectively.
Figure 2B:
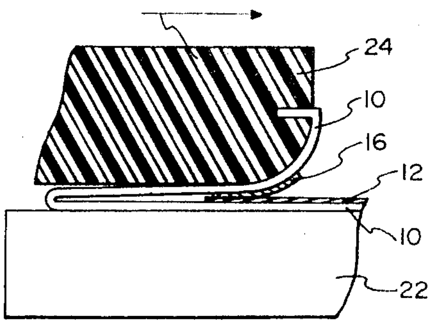

The operation of the slide switch of FIG. 2 is illustrated in more detail in the partial views of FIGS. 2A and 2B wherein like elements are identified by like reference characters. FIG. 2A illustrates the switch in the open state with the shorting circuit 16 withdrawn from the circuits 12. When the actuator 24 is moved inwardly as shown in FIG. 2B, the substrate 10 rolls at the fold such that shorting circuit 16 engages circuits 12 thus coupling them together.

It will be apparent from FIGS. 2, 2A and 2B that any of a wide variety of latching arrangements may also be provided with the illustrated structure such as simple detents or a pawl ratchet-cam assembly in order that the switch once actuated will remain in an operated state until deactivated.

Figure 3A:
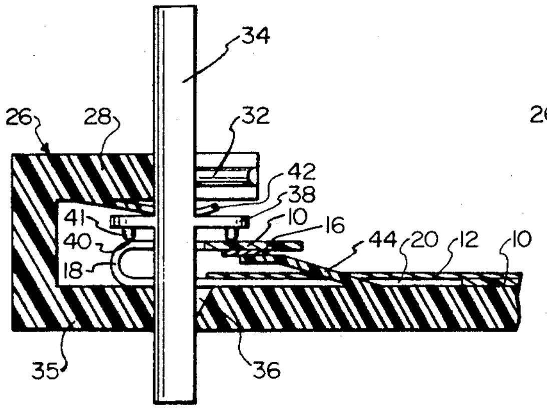
FIGS. 3A and 3B are cross-section views of a normally open pushbutton switch embodiment of the present invention in the normal and operated states respectively.
Figure 3B:
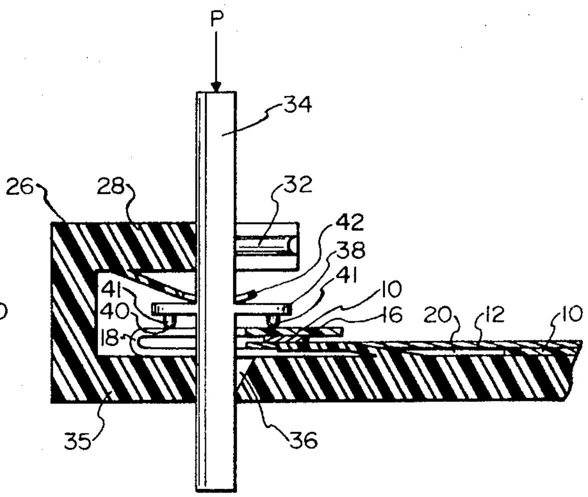
Figure 4:
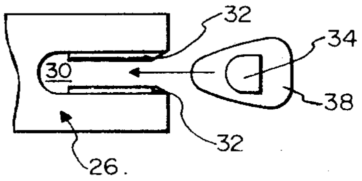
FIG. 4 is a partial top-view of the holder and actuator portions of the switch of FIGS. 3A and 3B.

FIGS. 3A and 3B illustrate in cross-section a normally open pushbutton switch embodiment of the present invention wherein the flexible printed wiring element of FIGS. 1A and 1B including the illustrated rectangular aperture 20 is of utility. Elements common to those shown in FIGS. 1A and 1B are identified by common reference numerals. The printed wiring substrate 10 is folded upon itself along hinge line 18 such that the shorting circuit 16 is in vertical alignment with the longitudinal circuits 12. The folded flexible printed wiring element is inserted in a holder element 26 which is also illustrated in the partial top-view of FIG. 4. In cross-section the holder 26 is generally "c" shaped and may be formed of any of a variety of plastic materials. The upper portion 28 of holder 26 is slotted, as shown in FIG. 4, and provided at the inner edges of the slot 30 with ridges 32 which serve to retain a switch actuator 34. The lower portion 35 of holder 26 is provided with an actuator receiving aperture 36 which is preferably tapered at the edge facing the open end of the holder. The actuator 34 may thus be inserted through the rectangular aperture 20 (FIGS. 1A and 1B) in the flexible printed wiring element and at an angle through the tapered aperture 36 in the lower portion of holder 26. The actuator 34 is then rotated toward the holder opening until it snaps into position and is retained by the ridges 32 in the upper portion 28.

The actuator 34 is provided with a laterally extending portion 38 adapted to engage the flexible printed wiring element substrate 10 such that when the actuator 34 is depressed the shorting circuit 16 is urged into electrical contact with each of the plurality of underlying longitudinal circuits. The laterally extending portion 38 of actuator 34 is also preferred to contact the substrate 10 at an additional point 40 proximate the hinge line 18 in order to assure full surface engagement between shorting circuit 16 and longitudinal circuits 12. In the embodiment illustrated in FIGS. 3A, 3B and 4 the laterally extending portion 38 of actuator 34 is shown as a triangular plate having a rounded protrusion 41 at each point that pressure is to be applied to the flexible printed wiring element.

The upper portion 28 of holder element 26 is provided with a downwardly extending actuator return spring 42 and the lower portion 35 is provided with an upwardly extending shorting circuit return spring 44. In practice it is convenient to mold the return springs 42 and 44 as integral portions of the holder element 26. Many plastic materials having suitable resiliency characteristics will be apparent to those skilled in the art.

In operation, pressure, P, is applied to the actuator 34 such that the shorting circuit 16 is urged into electrical contact with each of the plurality of longitudinal circuits 12. In the normally open embodiment illustrated in FIGS. 3A and 3B the shorting circuit return spring 44 is inwardly biased more than (i.e. is stronger than) the actuator return spring 42. When no external pressure is applied to actuator 34 the shorting circuit return spring 44 will thus maintain the switch in an open circuit configuration.

Figure 5A:
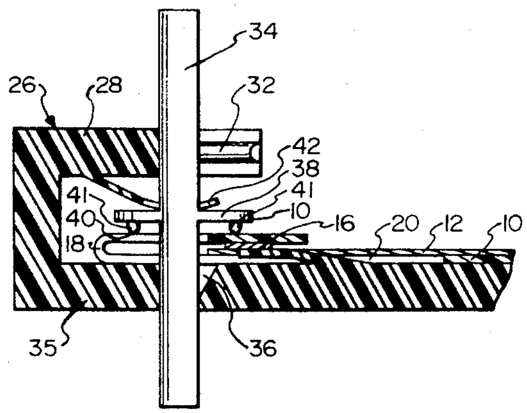
FIGS. 5A and 5B are cross-section views of a normally closed pushbutton switch embodiment of the present invention in the normal and operated states respectively.
Figure 5B:
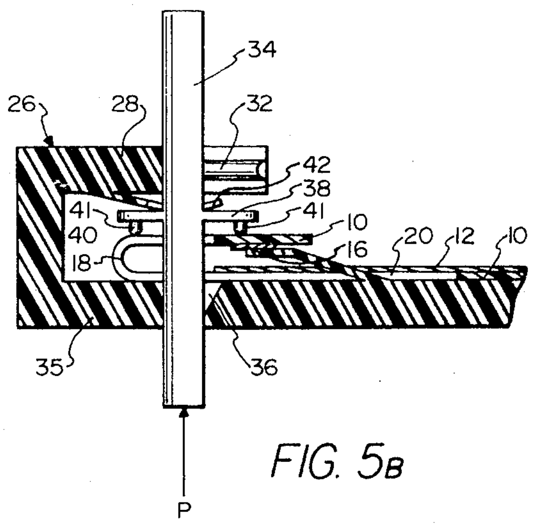

A normally closed pushbutton switch embodiment of the present invention is illustrated in the normal and operated states in FIGS. 5A and 5B respectively. The structure and operation of the normally closed switch is identical to that of the normally open embodiment illustrated in FIGS. 3A and 3B with two exceptions. With the normally closed switch the actuator return spring 42 is inwardly biased more than is the shorting circuit return spring 44. In the absence of external pressure, P, being applied to actuator 34 the actuator return spring 42 operates to maintain the shorting circuit 17 in electrical contact with the plurality of longitudinal circuits 12. The second difference is that the external pressure necessary to open the switch is applied at the opposite end of actuator 34 from that used to close the normally open embodiment.

For economy of construction the pushbutton switch actuators 34 for the normally open and normally closed switches would preferably be identical and extend beyond the upper and lower surfaces of the holder element 26. It will be understood, however, that the actuator need extend from the holder surface only in the direction from which actuating pressure is to be applied. The other end need only extend into the holder 26 a distance sufficient to retain the actuator 34 in position.

As an alternative to the laterally extending portion 38 of actuator 34 it is also possible to provide a plurality of molded spring elements on the actuator 34 arranged such as to appropriately contact the flexible printed wiring element.

From the foregoing description it will be seen that the Applicant has provided a new and novel flexible printed wiring switch wherein the objectives set forth hereinabove are efficiently achieved. Since certain changes in the above-described construction will become apparent to those skilled in the art without departure from the scope of the invention it is intended that all matter set forth in the description or shown in the appended drawings shall be interpreted as illustrative and not in a limiting sense.

Having described what is new and novel and desired to secure by Letters Patent, what is claimed is:

1. A flexible printed wiring switch comprising a unitary flexible printed wiring element having a plurality of longitudinally parallel printed circuits and a shorting circuit spaced apart from the ends of and arranged transversely with respect to said longitudinal circuits, said flexible printed wiring element being folded transversely upon itself such that said longitudinal circuits are in a facing relationship to said shorting circuit, and an actuator for selectively urging said shorting circuit into electrical continuity with said longitudinal circuits to thereby selectively couple said longitudinal circuits together.

2. A switch as recited in claim 1 wherein said actuator comprises a slide member affixed to the end of said flexible printed wiring element proximate said shorting circuit and adapted for movement in longitudinal translation with respect to said longitudinal circuits, whereby translation of said slide member toward said longitudinal circuits urges said shorting circuit into sliding electrical contact with each said plurality of longitudinal circuits.

3. A switch as recited in claim 2 further including means for biasing said slide member such as to maintain said shorting circuit in a preselected position with respect to said longitudinal circuits.

4. A switch as recited in claim 1 further including said flexible printed wiring element having a longitudinally extending aperture disposed therethrough between said longitudinal circuits, and being transversely folded upon itself such that said shorting circuit is in vertical alignment with said plurality of longitudinal circuits, said actuator comprises a shaft disposed through said aperture in said flexible printed wiring element and having laterally extending means for engaging said flexible printed wiring element and selectively urging said shorting circuit into electrical continuity with said plurality of longitudinal circuits, a holder element adapted to receive said folded flexible printed wiring element and to receive and retain said actuator in alignment with said flexible printed wiring element such that said actuator is vertically movable with respect thereto.

5. A switch as recited in claim 4 further including a first spring biasing means fixed to said holder element and engaging said actuator such as to urge said actuator toward said flexible printed wiring element, a second spring biasing means fixed to said holder element and engaging said shorting circuit such as to urge said shorting circuit away from said plurality of longitudinal circuits in opposition to said first spring biasing means, and the bias provided by said first and second spring biasing means being selected with respect to one another such as to maintain said shorting circuit in a preselected vertical position with respect to said plurality of longitudinal circuits.

6. A switch as recited in claim 5 wherein said first spring biasing means provides a greater bias than is provided by said second spring biasing means such that said shorting circuit is maintained in electrical continuity with said plurality of longitudinal circuits to thereby provide a normally closed switch to be selectively opened by said actuator.

7. A switch as recited in claim 5 wherein said second spring biasing means provides a greater bias than is provided by said first spring biasing means such that said shorting circuit is maintained apart from said plurality of longitudinal circuits to thereby provide a normally open switch to be selectively closed by said actuator.

8. A switch as recited in claim 5 wherein said first and second spring biasing means are leaf springs integrally formed with said holder element.

9. A switch as recited in claim 4 wherein said laterally extending means of said actuator comprises a plate integrally formed with said shaft and having a plurality of protrusions extending from the surface thereof which engages said flexible printed wiring element, one such protrusion disposed in alignment with each of said longitudinal circuits.

* * * * *